US006735065B2

United States Patent
Graf et al.

(10) Patent No.: US 6,735,065 B2
(45) Date of Patent: May 11, 2004

(54) SEMICONDUCTOR MODULE

(75) Inventors: Alfons Graf, Kaufering (DE); Jenoe Tihanyi, Kirchheim (DE); Wolfgang Tröger, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/141,842

(22) Filed: May 9, 2002

(65) Prior Publication Data
US 2002/0167065 A1 Nov. 14, 2002

(30) Foreign Application Priority Data

May 9, 2001 (DE) .......................... 101 22 363

(51) Int. Cl.[7] .............................................. H02H 5/04
(52) U.S. Cl. .................................. 361/103; 361/104
(58) Field of Search ........................... 361/103, 104; 337/403, 183, 404, 405

(56) References Cited

U.S. PATENT DOCUMENTS

| 4,677,412 A | * | 6/1987 | Sibalis ........................ 334/401 |
| 5,099,381 A | * | 3/1992 | Wilcox ........................ 361/103 |
| 5,652,562 A | * | 7/1997 | Riley ........................... 337/405 |
| 5,796,152 A | * | 8/1998 | Carr et al. ................... 257/415 |
| 6,243,245 B1 | * | 6/2001 | Totsuka et al. ............. 361/103 |
| 6,331,763 B1 | * | 12/2001 | Thomas et al. ............. 320/136 |
| 6,504,467 B1 | * | 1/2003 | Berberich et al. .......... 337/139 |

FOREIGN PATENT DOCUMENTS

| DE | 198 05 785 C1 | 6/1999 | |
| DE | 198 32 558 A1 | 1/2000 | |
| JP | 07336876 A | * 12/1995 | ............ H02H/7/00 |

* cited by examiner

*Primary Examiner*—Brian Sircus
*Assistant Examiner*—Z Kitov
(74) *Attorney, Agent, or Firm*—Laurence A. Greenberg; Werner H. Stemer; Gregory L. Mayback

(57) ABSTRACT

A semiconductor module includes a housing with at least one semiconductor component that is conductively connected to at least one output line. An integrated temperature sensor is also housed in the housing. This sensor is connected, via at least one of its load terminals, to a terminal for receiving a supply potential. The temperature sensor conducts a load current that heats-up the temperature sensor when a first temperature threshold is crossed and a supply potential is in being supplied. A housed interruption device is arranged in such a way that it interrupts the output lines carrying the load current when a second temperature threshold has been exceeded.

19 Claims, 5 Drawing Sheets

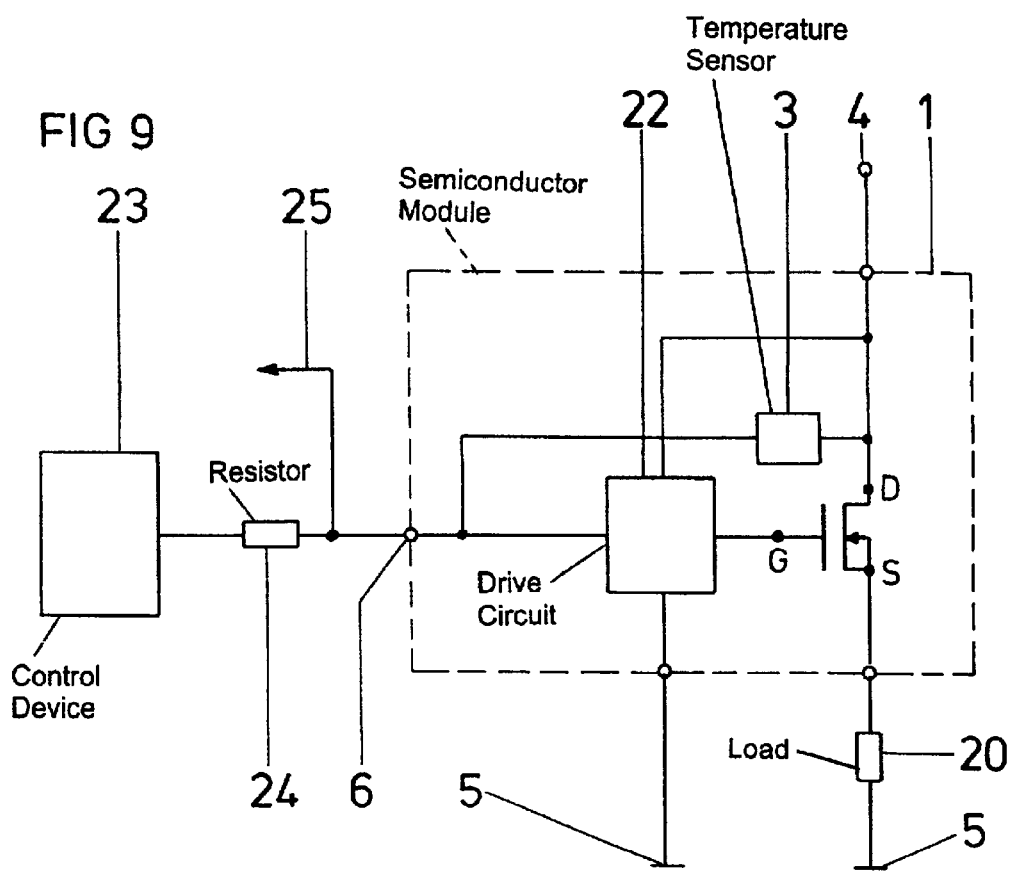
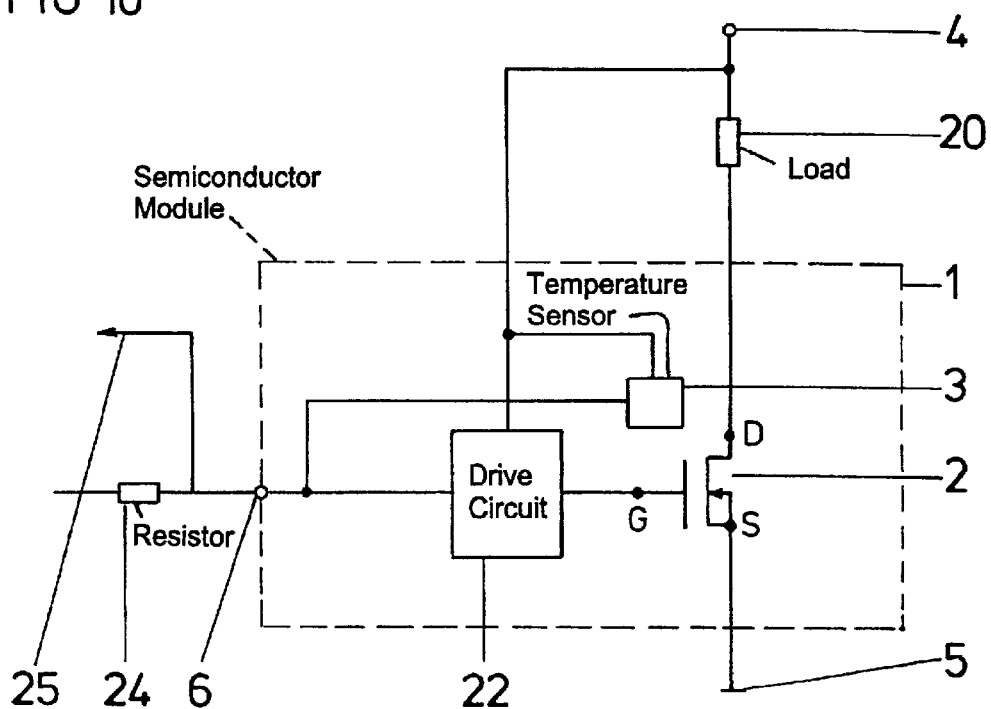

SEMICONDUCTOR MODULE

BACKGROUND OF THE INVENTION

Field of the Invention

The invention relates to a semiconductor module with a housing, a semiconductor component that is surrounded by the housing, and an integrated temperature sensor and interrupt device housed in the housing.

This type of semiconductor component can have any construction; i.e. it can be an MOS (Metal Oxide Semiconductor) transistor, an IGBT (Insulated Gate Bipolar Transistor), a JFET (Junction Field Effect Transistor), a thyristor, and so on. The structure and function of such semiconductor components are known from multiple sources, so that it is unnecessary to provide a detailed description of these semiconductor components here. The exemplary semiconductor component herein is a field-effect-controlled power MOS transistor, also known as a power MOSFET (Metal Oxide Semiconductor Field Effect Transistor), although the invention is not limited to this semiconductor component.

When semiconductor components such as power MOSFETs are utilized, the possibility of an error or failure can never be completely ruled out. Minor errors, which have almost no effect on the function of the semiconductor component, are distinguishable from serious errors, which cause functional impairment, and which in extreme cases, cause destruction of the power MOSFET. A particularly serious error is what is known as alloying-through or melting of a power MOSFET. In a MOSFET that is constructed as a high-side switch, a short can occur between the positive supply potential and the output terminal. In a MOSFET that is constructed as a low-side switch, the output terminal can be shorted to the device ground. The shorted load current of the respective power MOSFET can no longer be controlled by its drive logic. Thus, the load current is limited only by the impedance of the load and the defective transistor in the load circuit.

If a MOSFET is melted through and therefore shorted, the current flow is uncontrolled, and is determined by the voltage source and the resistances of the load and the melted MOSFET. The current is therefore smaller than in normal operation, and the fuse does not trip. The maximum power loss at the destroyed MOSFET occurs when its resistance reaches the order of magnitude of the load resistance. A voltage shearing between the MOSFET and the load then occurs, i.e. a matching for power transfer, or a power maximum. Depending on the size of the load resistance and the possibilities for cooling the melted, nonfunctional MOSFET, this leads to an extreme temperature rise of the MOSFET and ultimately the MOSFET or the chip environment will catch on fire.

As a precaution against overheating, a temperature sensor is typically provided, which switches the power MOSFET off given excessive overheating of the power MOSFET, for instance, as a consequence of a short-circuit current. But such a remedy only works as long as the power MOSFET is not defective. Besides this, the problem with this type of arrangement is that, in a semiconductor module with a plurality of power MOSFETs, it is extremely difficult technically to place a temperature sensor in the vicinity of such a MOSFET. Furthermore, it is disadvantageous to utilize a single temperature sensor that detects the temperature of the entire semiconductor module, because due to the poor heat conductivity inside the housing, the temperature sensor only senses an overtemperature after a long delay. Therefore, an overtemperature of a defective power MOSFET is only detected by the temperature sensor when the MOSFET is already disabled.

Beyond this, even in protected circuits such as this, extreme conditions occur, which can cause damage to the power MOSFET. The injury to the power MOSFET can manifest itself in the flowing of an uncontrollable load current though the power MOSFET and the presence of a forward bias at the drain and source terminals. The problem with this is that the power MOSFET can go out of control while remaining fully functional and continuing to conduct the short-circuit current. The current flow through the load circuit of the power MOSFET is not even stopped when the power MOSFET and the motherboard on which the power MOSFET is disposed is heated above the melting point of the solder, for instance above 250° C. If the heating continues, for instance above 300° C., the MOSFET is still not destroyed, but merely damaged. This effect is particularly serious when the heating of the power MOSFET and its environment is not abrupt, but rather occurs relatively slowly over several minutes. The power MOSFET and its environment can heat up progressively until the environment ignites and a fire starts.

Furthermore, a malfunction may not necessarily always be due to a short circuit. Rather, uncontrollable errors comparable to the errors just described can already occur given a nominal load current and a defective semiconductor component.

Issued German Patent DE 198 05 785 C1 describes a power semiconductor module that irreversibly interrupts the load circuit in case of an impermissible heating of the load circuit of a power semiconductor component. To accomplish this, interruption means are provided, which exhibit a volume expansion property in the case of an impermissibly high temperature, and which force open the load terminals and thus interrupt the load circuit in a defined and irreversible manner when a temperature threshold is crossed.

The interruption means described in Issued German Patent DE 198 05 785 C1 is problematic with respect to finding suitable materials that respond precisely at the desired temperature threshold. A still greater problem is that the processing temperature of this material approximately corresponds to the temperature at which this thermally ignitable material will react. For instance, the highest processing temperature in the assembly of the semiconductor module is approx. 270° C. The reaction temperature of this thermally ignitable material must thus be sufficiently greater than this maximum processing temperature in order to avoid a potential false activation, so that the thermally ignitable material may only ignite at a temperature above 300° C. In any case, there are many instances of application in which the semiconductor component already does serious harm at a temperature approximately corresponding to the processing temperature.

There also exists the need to furnish a power semiconductor module with a thermal protection mechanism that trips in a defined fashion at an arbitrary temperature, preferably a low temperature. The subsequent fate of the power semiconductor module is irrelevant, the only need is to guarantee a reliable interruption.

SUMMARY OF THE INVENTION

It is accordingly an object of the invention to provide a semiconductor module which overcomes the above-mentioned disadvantages of the prior art apparatus of this general type.

In particular, it is an object of the invention to reliably interrupt the load circuit of a housed semiconductor component in the case of a malfunction in the load circuit of the semiconductor component, given that the processing temperature is not excessive.

With the foregoing and other objects in view there is provided, in accordance with the invention, a semiconductor module, including: a housing; terminals for receiving a supply potential; at least one output line for carrying a load current; at least one semiconductor component disposed in the housing, the semiconductor component being conductively connected to the output line; an integrated temperature sensor being housed in the housing, the temperature sensor having a load terminal connected to one of the terminals for receiving the supply potential; and an interruption device housed in the housing. When a first temperature threshold is being exceeded and a first supply potential is being supplied to the terminals for receiving the supply potential, then the temperature sensor conducts a load current causing heating of the temperature sensor. The interruption device is configured for irreversibly interrupting at least the output line when a second temperature threshold is exceeded.

The inventive semiconductor module thus includes a temperature sensor and an interruption device for irreversibly interrupting the load current in the case of a malfunction. The irreversible break is characterized by two distinct successive steps:

(1) First, a temperature sensor is provided which detects and monitors the temperature of the semiconductor chip and which is activated at a trip temperature. The term "trip temperature" refers to a critical temperature threshold TS upon whose crossing the protective mechanism engages (i.e. the temperature sensor is activated).

(2) Secondly, an interruption device is provided which irreversibly interrupts the load circuit of the monitored power MOSFET given that the ignition temperature has been exceeded. The ignition temperature is greater than the trip temperature. The ignition signal by means of which the interruption device is ignited is the temperature of the activated temperature sensor. The term "ignition temperature" refers to the temperature at which the thermally active material of the interruption device ignites. When the thermally active material of the interruption device ignites, its volume rapidly expands. This volume expansion can be expressed in a strongly oxidizing or exploding or heavily frothing character.

The particular advantage of the invention consists in the linking of two conditions that must exist simultaneously in order to trigger the irreversible interruption which ultimately leads to the destruction of the MOSFET:

(a) The first condition is the presence of an overtemperature (trip temperature) and the simultaneous presence of an operating voltage. The trip temperature can be set arbitrarily low as a precondition for tripping given the achievement of this temperature. In case this temperature should be attained during the processing of the semiconductor module, for instance during the soldering of the terminals, the other requirement for satisfying the first condition, namely the application of the operating voltage, is not satisfied, and thus the temperature sensor is not activated.

(b) The second condition is the ignition temperature. The ignition temperature of the actual thermally active and thus destructive material can be any temperature above the trip temperature. This temperature is achieved in that, given the attainment of the trip temperature and the presence of the operating voltage, a mechanism is set in motion which induces this ignition temperature. For instance, this temperature can be generated by the temperature sensor, which has been activated and is therefore heating up intensely.

The advantage of this arrangement is that the ignition signal is released only if an ignition temperature is exceeded and the operating voltage is simultaneously being applied, i.e. not during the soldering of the unit, because at this time the required operating voltage could not be present, although the ignition temperature may be.

The following advantages are gained by combining the two conditions:

I. Because the trip mechanism is separate from the ignition mechanism, this ignition temperature can be selected sufficiently far from the trip temperature. It is therefore possible to avoid, as far as possible, accidental ignition of the interruption device, for instance during the processing of the semiconductor module or upon the triggering of the temperature sensor.

II. The overall interruption process can also be switched from outside, either directly via the supply voltage or via a separately provided terminal of the power MOSFET. The overall tripping process can thus be sparked either internally or externally.

III. Lastly, the overall tripping process can be advantageously dimensioned in view of the sensitivity of the temperature sensor, so that the trip temperature can be set to a specific value in a highly precise fashion.

Typically, the load systems of the semiconductor component and the temperature sensor are arranged in parallel fashion between the terminals for the supply voltage. The temperature sensor is supplied by the supply voltage of the protected MOSFET. But the temperature sensor may also conceivably have a separate supply voltage and thus function independently of the MOSFET.

Typically, the temperature sensor is not connected to the external connecting leads. Rather, it is connected within the housing to at least one load terminal of the semiconductor component and alternatively to a drive circuit which drives the semiconductor component. In this case, a separate external terminal for the temperature sensor can be forgone.

What is essential to the functioning of the inventive semiconductor module is that the second temperature threshold is higher than the first temperature threshold. Typically, the first temperature threshold is in the range between 250° C. and 300° C., whereas the second temperature threshold greater than 300° C.

It is particularly important for the function of the inventive temperature sensor that the temperature sensor, and alternatively the interruption device as well, be arranged in the immediate vicinity of the semiconductor component. This produces a thermal coupling between the temperature sensor and the MOSFET, which guarantees an immediate reaction of the temperature sensor in the case of a malfunction.

A triac or thyristor is utilized as a temperature sensor, whereby the thyristor or triac advantageously does not have a control terminal.

If the temperature sensor is constructed as a triac, an additional advantage is gained in that the temperature sensor also trips if the poles are connected the wrong way. If the poles of the power MOSFET are connected the wrong way, a load current which is limited only by the load and the diode flow voltage flows through the inverse diode, which is usually inherent in the power MOSFET. In this case, the power MOSFET no longer functions as a controllable switch. Because of the large voltage drop of the inverse diode, the power MOSFET heats up intensely, and it is no longer possible to cut off the current flow. In the extreme case, absent a separately provided reverse polarity circuit, the power MOSFET can heat up to an extreme degree. In this case, the sensor signal provided by the triac can be utilized as a trigger signal for a trip mechanism of any type which also acts given pole inversion. The switching characteristic of the temperature sensor could also be laid out thermally asymmetrically for a mispole operation and a normal operation; i.e., the current-voltage characteristic curve of the triac can be optimally designed with respect to its first and third quadrants.

Given the utilization of a thyristor as a temperature sensor, the trip temperature can be purposefully set and thus adapted to the requirements.

Instead of a thyristor or triac, it is possible to utilize any temperature sensor that causes a rapid and intense current rise when the trip temperature is exceeded. This temperature sensor can also be constructed as a rapidly heating destructive resistance, a bimetal switch, or the like.

It is particularly important to the function of the inventive semiconductor module that the interruption device is arranged in the immediate vicinity of the bonding wires carrying the load current. In particular, it can be arranged precisely underneath these bonding wires.

In accordance with an added feature of the invention, a fuse can be alternatively or additionally provided as an interruption device. This fuse is connected in series with the load system of the semiconductor component and the temperature sensor.

In accordance with an additional feature of the invention, besides its primary function as a temperature sensor, the thyristor (or triac) simultaneously functions as an interruption device. Here, the intense heating of the thyristor or triac leads directly to the bursting of the housing, and thus the destruction of the semiconductor module.

In accordance with another feature of the invention, the interruption device contains an ignitable, volume-expansive material. The volume-expansive material exhibits a foaming and/or strongly oxidizing and/or explosive characteristic when the second temperature threshold is exceeded.

In accordance with a further feature of the invention, the semiconductor component is a controllable power semiconductor component, in particular a power MOSFET. But it would also be possible to utilize any other semiconductor switch, for instance an IGBT, a JFET, a bipolar transistor, and so on.

In accordance with a concomitant feature of the invention, the semiconductor component and the temperature sensor are integrated monolithically in a single chip. This is particularly advantageous from a production standpoint. The advantage of a chip on chip assembly is that the sensor is usually not destroyed when the MOSFET is destroyed.

Other features which are considered as characteristic for the invention are set forth in the appended claims.

Although the invention is illustrated and described herein as embodied in a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 9 is a circuit diagram illustrating a third application of the inventive semiconductor module; and FIG. 10 is a circuit diagram illustrating a fourth application of the inventive semiconductor module.

DESCRIPTION OF THE PREFERRED EMBODIMENTS

Figure 2:
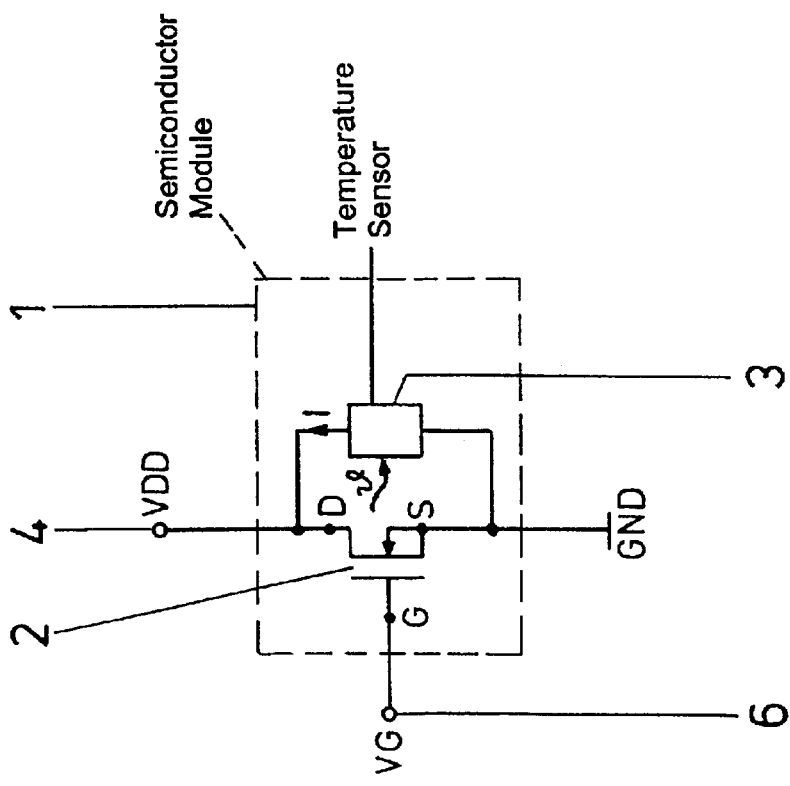
FIG. 2 is a circuit diagram of development of the general embodiment of the semiconductor module.

Unless otherwise indicated, identical or functionally identical elements and signals are provided with the same reference characters in the Figures.

Figure 1:
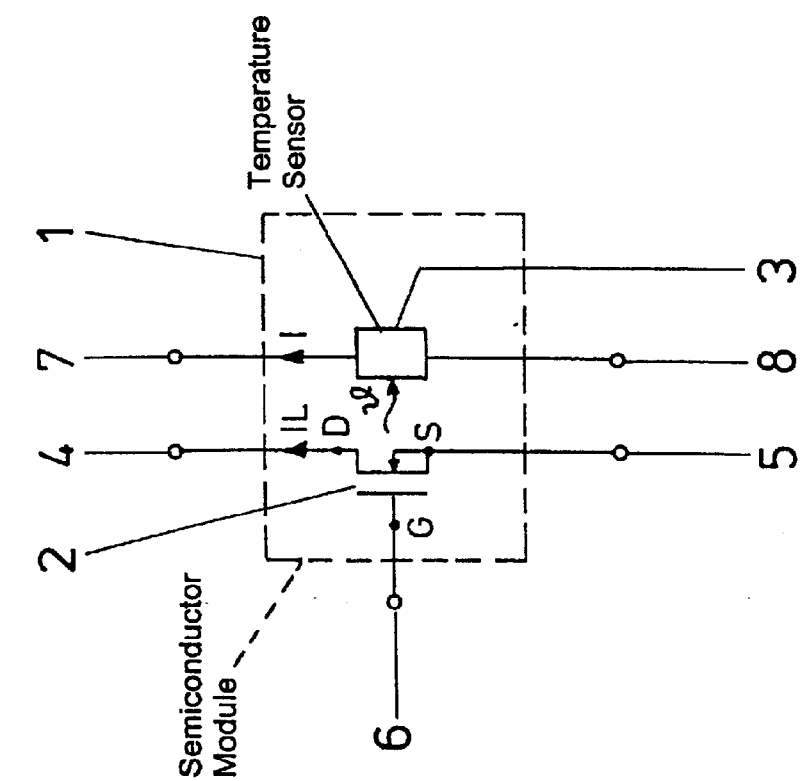
FIG. 1 is a circuit diagram of a general embodiment of the inventive semiconductor module.

Referring now to the figures of the drawing in detail and first, particularly, to FIG. 1 thereof, there is shown an inventive semiconductor module that includes a power MOSFET 2 and a temperature sensor 3. The drain-source load system of the power MOSFET 2 is connected between two terminals 4, 5 at which a supply voltage is present. The gate terminal G of the MOSFET 2 is connected to a control terminal 6. The temperature sensor 3 is arranged between two additional terminals 7, 8 at which a second supply voltage can be applied. The temperature sensor 3 is arranged in the immediate vicinity of, and is in thermal contact with, the MOSFET 2, so that it can detect the temperature of the MOSFET 2.

In contrast to the general circuit diagram of a semiconductor module 1 shown in FIG. 1, in which the supply voltages of the MOSFET 2 and the temperature sensor 3 are different, FIG. 2 shows an embodiment of the semiconductor module 1 in which the temperature sensor 3 and the MOSFET 2 are supplied with the same supply voltage. In the example shown in FIG. 2, a positive supply potential VDD is present at the first terminal 4, whereas the potential of the reference ground GND is present at the second terminal 5. A gate control potential VG can be coupled in via the control terminal 6.

Figures 3A, 3B:
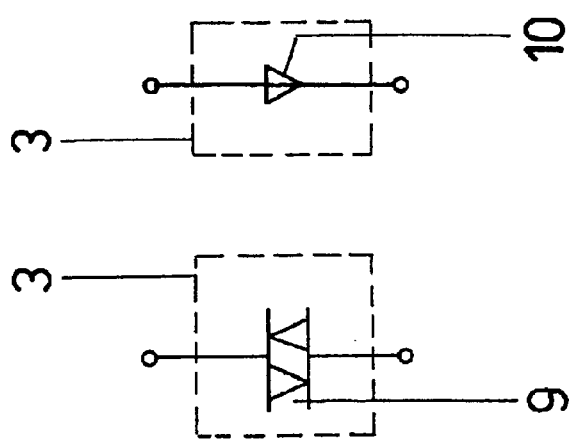
FIG. 3a shows a temperature sensor formed as a triac.
FIG. 3b shows a temperature sensor formed as a thyristor.

The temperature sensor 3 can be advantageously integrated into the power MOSFET 2, so that it detects and signals an impending thermal destruction of the power MOSFET 2, and thus of the semiconductor module, directly where it is to occur, namely on the semiconductor chip. The temperature sensor 3 must be supplied with a voltage in order to function properly. In the ideal case, a drive is not necessary for the temperature sensor 3. A triac, shown in FIG. 3a, or a thyristor, shown in FIG. 3b, is advantageously suitable as the temperature sensor 3. Unlike known triacs and thyristors, the components shown in FIGS. 3a and 3b have no gate control.

Figure 4:
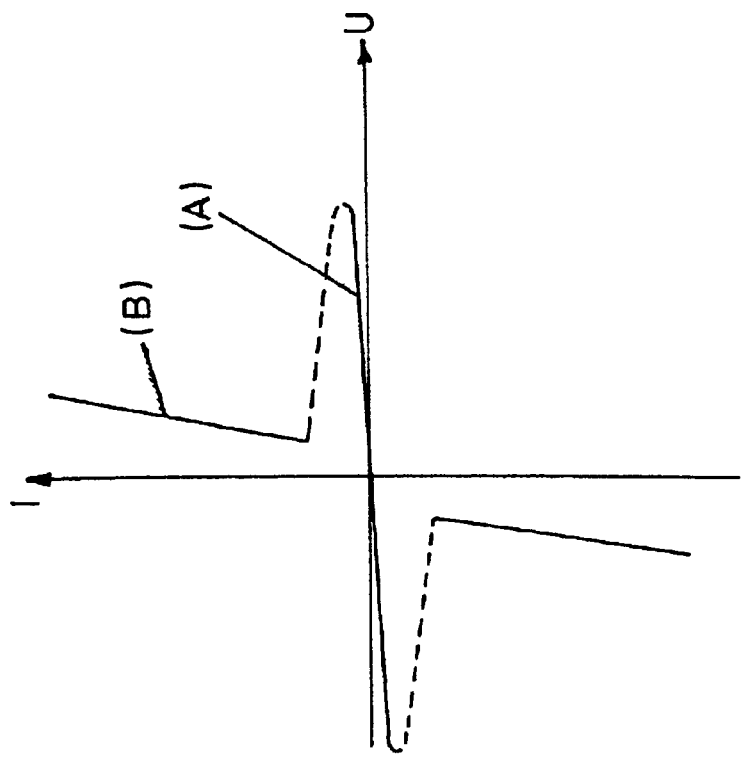
FIG. 4 is the current-voltage characteristic curve of a temperature sensor that is constructed as a triac, at low temperature and at high temperature.

FIG. 4 shows the current-voltage characteristic curve for a temperature sensor 3 that is constructed as a triac or a thyristor.

The characteristic curve in FIG. 4 is characterized by a first region (curve A) with a small slope and a second region (curve B) with a very steep slope. Because the thyristor (or triac) cannot be activated for lack of a gate drive, its characteristic curve exhibits the curve (A) in normal operation. Thus, in normal operation (i.e. at temperatures which are less than the temperature threshold of the thyristor or triac (T<Ts)), the thyristor (triac) is blocked, and only a minimal blocking current flows, if any.

But the thyristor or triac automatically switches on at a defined, relatively high temperature threshold (T>TS). Therefore, the semiconductor components that are utilized for the temperature sensors 3, which are thyristors or triacs, have a very high temperature threshold, for instance in the range between 250 and 300° C. These high temperature thresholds are typically substantially undershot in the normal operation of the power MOSFET 2 and are attained only given a destroyed out-of-control power MOSFET 2, so that the thyristor or triac ignites only in the event of a malfunction, i.e. when the temperature threshold (T>TS) is exceeded. The current-voltage characteristic curve then exhibits a very large slope (curve B). The sensor signal that is generated by the igniting of the thyristor or triac can no longer be used for protecting the power MOSFET 2, because this is typically already destroyed; however, it is utilized as a sensor signal for protecting the semiconductor module 1 or its environment.

Figure 5:
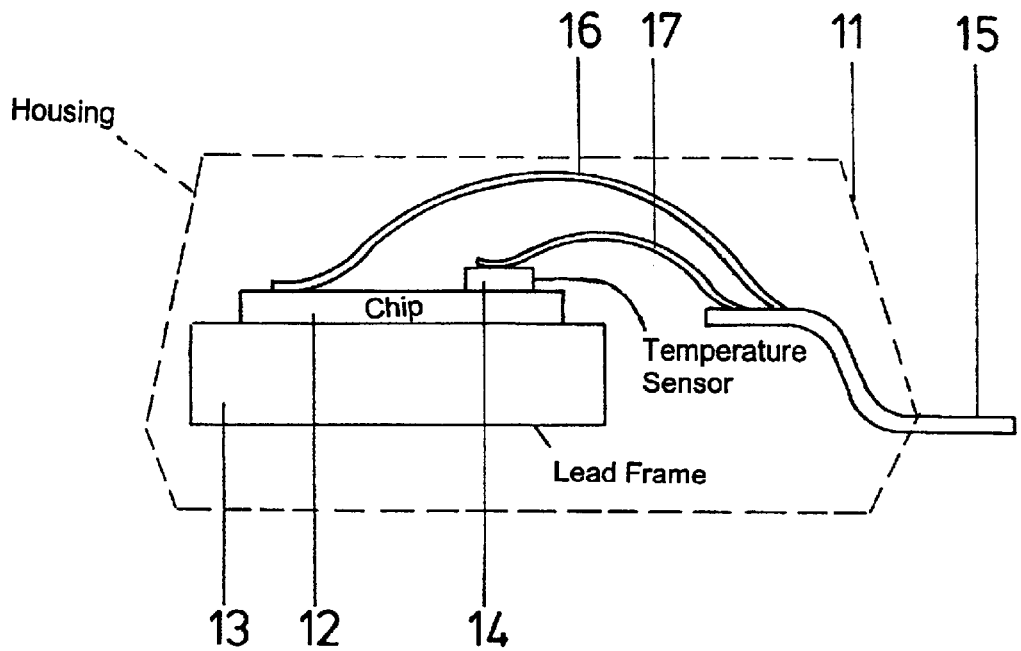
FIG. 5 is a sectional representation of a first exemplary embodiment of the inventive semiconductor module.
Figure 6:
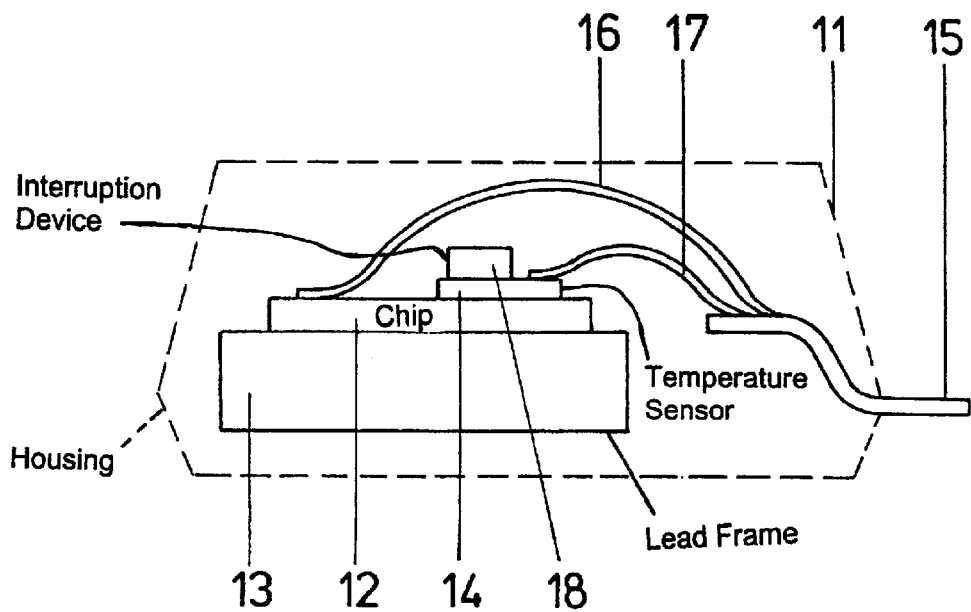
FIG. 6 is a sectional representation of a second exemplary embodiment of the inventive semiconductor module.

FIGS. 5 and 6 show two sections of an inventive semiconductor module, in order to illustrate the operation of the inventive temperature sensor with the interruption device.

The semiconductor module 1 shown in FIGS. 5 and 6 includes a housing 11. The housing 11 surrounds a semiconductor chip 12, which is fastened onto a lead frame 13. The semiconductor chip 12 can contain one or more power MOSFETs 2. On the surface of the semiconductor chip 12 is a temperature sensor 14, which is integrated in an additional semiconductor body. The temperature sensor 14 can be constructed as a triac 9 or a thyristor 10 as shown in FIGS. 3a and 3b.

In the present exemplary embodiments, the temperature sensor 14 is installed directly on the semiconductor chip 12. But this is not necessarily required. It is sufficient for the temperature sensor 14 to be thermally connected to the semiconductor chip 12, and the temperature sensor 14 is therefore situated in its immediate vicinity. Though this is not represented, another conceivable technique would be to place a thermally conductive layer between the temperature sensor 14 and the semiconductor chip 12 for the purpose of guaranteeing good thermal coupling between the semiconductor chip 12 and the temperature sensor 14.

In FIGS. 5 and 6, the temperature sensor 14 and the MOSFET are integrated in separate semiconductor bodies, respectively. But the temperature sensor 14 may also conceivably be integrated in the semiconductor chip 12. The temperature sensor 14 should ideally be constructed and installed independently of the semiconductor chip 12 and thus independently of the power MOSFET 2 integrated within it, so that the sensor is able to continue to work perfectly for a limited time given a damaged or destroyed power MOSFET 2. In this case, the chip-on-chip technology according to the exemplary embodiments shown in FIGS. 5 and 6 would be the obvious solution, in which the temperature sensor 14 is integrated in a separate semiconductor body and is therefore is able to work independently of a possible malfunction of the semiconductor chip 12 or the power MOSFET 2 within it. However, a fairly independent, monolithic integrating of the temperature sensor 14 into the semiconductor chip 12 is also possible.

The semiconductor module 1 further includes one or more terminal pins 15, which protrude from the housing 11 and which are in conductive contact with the semiconductor chip 12 via corresponding bonding wires 16. Additional bonding wires 17 are also provided, via which the temperatures sensor 14 is conductively contacted to the terminal pins 15. The semiconductor chip 12 and the temperature sensor 14 can be respectively connected to the terminals 4, 5 for the supply voltage VDD, GND and to a control potential VG by the terminal pins 15.

Next, the function of the temperature sensor 14 will be described with respect to the irreversible blowing behavior that takes place in the semiconductor module 1 in the event of an impermissibly high temperature.

In normal operation, and thus at temperatures below a critical temperature threshold T<TS, the temperature sensor 14 is blocked, and no load current I flows across the temperature sensor.

In the abnormal condition (T>TS), for instance given a short of one or more power MOSFETs 2, the temperature on the semiconductor chip 12 rises abruptly or slowly and uncontrollably until the critical temperature TS is exceeded. When the critical temperature TS is exceeded, the temperature sensor 14, which is thermally coupled with the semiconductor chip 12, abruptly becomes conductive and begins the conduct a current I via its load system. Because this current I is initially unlimited, a shorting of the supply voltage occurs. The temperature sensor 14 is thereby heated intensely within a short time. In the exemplary embodiment shown in FIG. 5, this leads to bursting of the housing 5, and thus the bonding wires 16 of the semiconductor chip 12 that carry the current are ripped. To accomplish this, the temperature sensor 14 is ideally situated in the immediate vicinity of the bonding wires 16, for instance directly below them.

Nevertheless, in the unfavorable case, the actual power MOSFET 2 on the semiconductor chip 12 is likewise damaged by the fusing of temperature sensor 14. The self-destruction of the power MOSFET 2, and therefore the current interruption is initiated within a very short time. But this is willingly accepted into the bargain. Rather, what is important here is that the self-destruction of the defective power MOSFET 2 and the current interruption occur as rapidly as possible, so that a further destructive environment will not be fostered. Thus much greater damage is prevented.

In the exemplary embodiment shown in FIG. 6; an interruption device 18 is additionally installed on the temperature sensor 14. In the event of a failure, the temperature sensor 14 is shorted and heats up in a very short time. The interruption device 18 has an ignition temperature. If the ignition temperature of the interruption device 18 is exceeded, it is ignited, and the volume-expansive characteristic of the interruption device 18 leads to bursting of the housing 11 and specifically to splitting or tearing of the bonding wires 16 carrying the current. The shorted load circuit of the defective power MOSFET 2 is thus interrupted in a defined and irreversible fashion.

Two different principles of the inventive arrangement are shown in FIGS. 5 and 6. In the example of FIG. 5, the temperature sensor 14 and the interruption device are realized by the temperature sensor 14 itself, whereas in the example shown in FIG. 6, the function of the volume-expansive material is realized by a separately provided interruption device 18.

FIGS. 7 to 10 show circuit diagrams of advantageous applications of the inventive semiconductor module.

Figure 7:
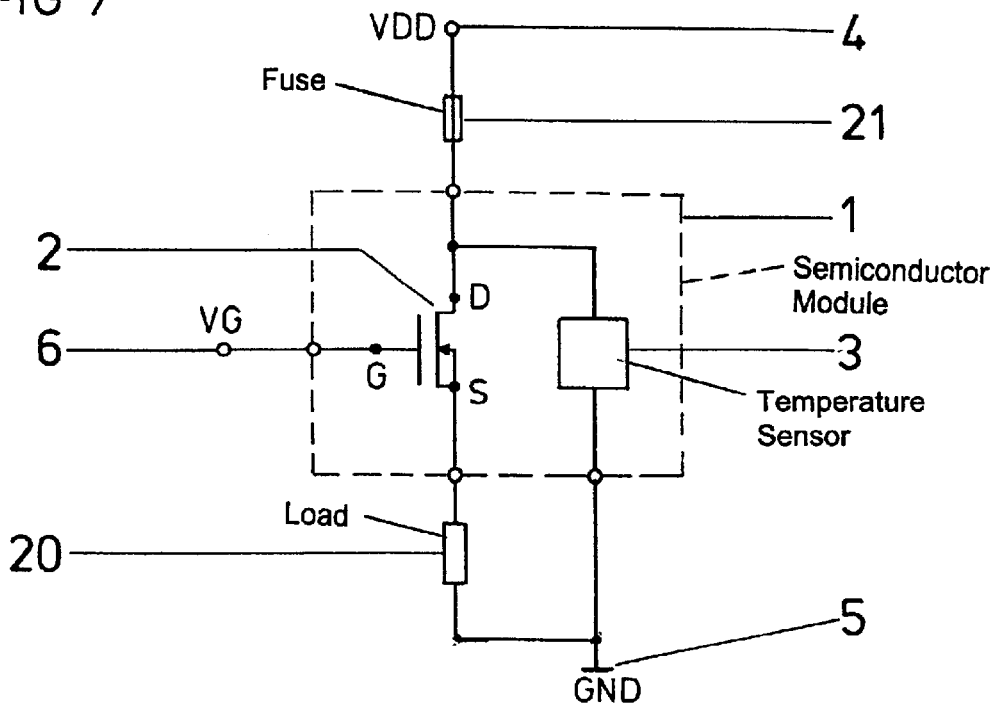
FIG. 7 is a circuit diagram illustrating a first application of the inventive semiconductor module.

FIG. 7 shows a power MOSFET 2 as a high-side switch. A load 20 is arranged between the source terminal S and the terminal 5 connected to the reference potential GND. The temperature sensor 3 is interposed between the drain terminal D of the power MOSFET 2 and the terminal 5. An external fuse 21, for instance a destructive resistor is also interposed into the load system of the power MOSFET 2. The fuse 21 is connected to the drain D of the power MOSFET 2. The fuse 21 serves here as an interruption device, which brings about an interruption of the current of the power MOSFET 2 given the triggering of the temperature sensor 3. Alternatively or additionally, the current interruption could also be accomplished via the temperature sensor 3.

Figure 8:
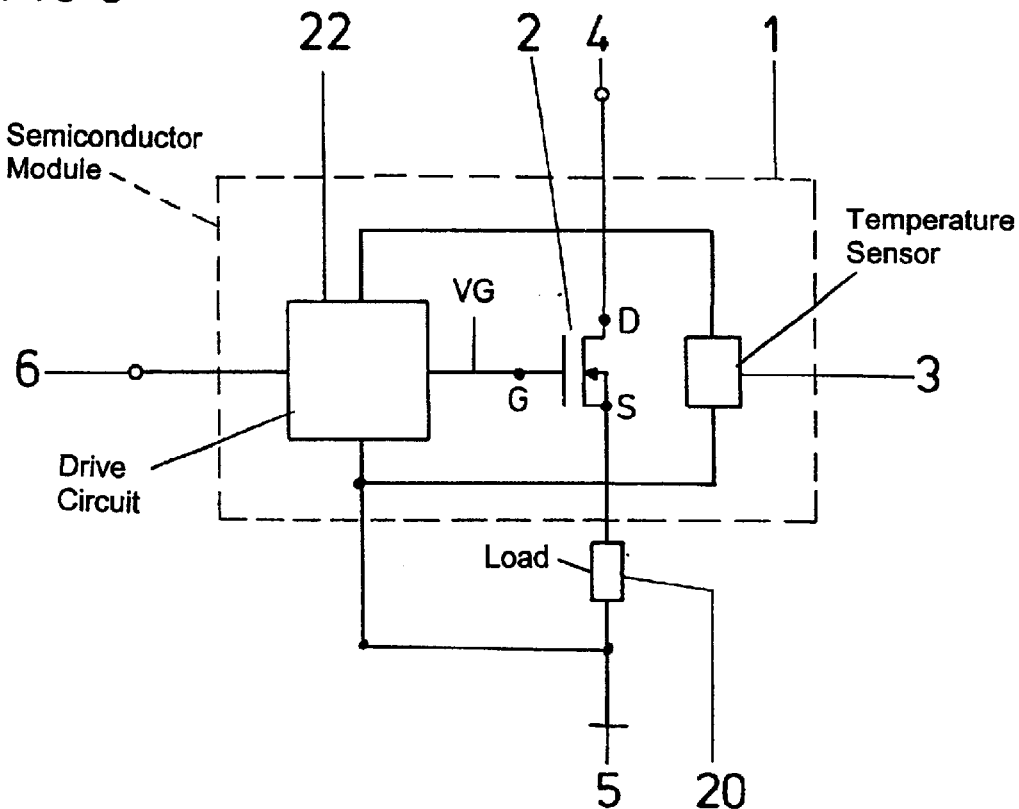
FIG. 8 is a circuit diagram illustrating a second application of the inventive semiconductor module.

FIG. 8 is a circuit diagram showing the power MOSFET 2 being constructed as a high-side switch as shown in FIG. 7 and also being constructed as a smart power switch. To this end, a drive circuit 22 is disposed between the control terminal 6 and the gate terminal G of the power MOSFET 2. The drive circuit 22 drives the power MOSFET 2 with a gate control potential VG. The drive circuit 22 is advantageously also disposed between the terminals 4, 5 of the supply voltage source.

In contrast to the exemplary embodiment shown in FIG. 8, the temperature sensor 3 in the exemplary embodiment shown in FIG. 9 is interposed between the drain terminal D and the control terminal 6. In the failure condition, the temperature sensor 3 provides the positive supply potential VDD to the input 6 as an error signal for further processing. Advantageously, a control device 23—for instance a microcontroller, microprocessor or logic circuit—is provided, which is coupled with the input 6 of the semiconductor 1 via an input resistor 24. The signal of the temperature sensor 3 can be input into the control device 23 by way of a feedback branch 25. If the trip temperature is not exceeded, the temperature sensor 3 blocks. The input of the semiconductor module 1 is then driven with the usual logic levels for the gate control potential VG, for instance 0 volts and 5 volts.

The advantage of the arrangement shown in FIG. 9 is that an additional, external terminal is not required for the temperature sensor 3, and thus the temperature sensor 3 can advantageously be in an integrated form.

In the exemplary embodiments shown in FIGS. 7 to 9, the operating voltage which is required for the functioning of the temperature sensor 3 is drawn directly from the drain potential of the power MOSFET 2. The risk of the power MOSFET also shorting only arises when this drain potential is also contained in the power MOSFET, and thus the above mentioned first condition is satisfied.

FIG. 10 shows the circuit diagram of a power MOSFET 2 that is constructed as a low-side switch, in which the load 20 is arranged between the drain terminal D and the terminal 4 connected to the positive supply potential VDD. The temperature sensor 3 is arranged between the input 6 and the terminal 4 connected to the positive supply potential VDD. But of course this could also be arranged between the terminals 4, 5.

In sum, it can be stated that the temperature sensor and the interruption device constructed as specified above represent a total departure from the prior art, in that an irreversible fuse mechanism for power semiconductor components can be provided, which links the interruption to two different conditions: the presence of a supply voltage and the presence of an overtemperature.

The present invention has been described to best explain the principle of the invention and its practical applications, however, the invention can also be realized in various other embodiments given suitable modifications.

We claim:

1. A semiconductor module, comprising:
   a housing;
   terminals for receiving a supply potential;
   at least one output line for carrying a load current;
   at least one semiconductor component disposed in said housing, said semiconductor component being conductively connected to said output line;
   an integrated temperature sensor being housed in said housing, said temperature sensor having a load terminal connected to one of said terminals for receiving the supply potential; and
   an interruption device being housed in said housing;
   when a first temperature threshold is being exceeded and a first supply potential is being supplied to said terminals for receiving the supply potential, then said temperature sensor conducting a load current causing heating of said temperature sensor; and
   said interruption device being configured for irreversibly interrupting at least said output line when a second temperature threshold is exceeded.

2. The semiconductor module according to claim 1, wherein:
   said semiconductor component has a load system connected between said terminals for receiving the supply potential;
   said temperature sensor has a load system connected between said terminals for receiving the supply potential; and
   said load system of said temperature sensor is configured in parallel with said load system of said semiconductor component.

3. The semiconductor module according to claim 1, wherein:
   said semiconductor component has a load terminal; and
   said temperature sensor is connected inside said housing to said load terminal of said semiconductor component.

4. The semiconductor module according to claim 1, comprising:
   a drive circuit for driving said semiconductor component, without directly electrically contacting an external terminal;
   said semiconductor component having a load terminal connected to said drive circuit.

5. The semiconductor module according to claim 1, wherein:
   the second temperature threshold is larger than the first temperature threshold.

6. The semiconductor module according to claim 1, wherein:
   the first temperature threshold is between 250° C. and 300° C.; and
   the second temperature threshold is greater than 300° C.

7. The semiconductor module according to claim 1, wherein:
   said temperature sensor is configured in an immediate vicinity of said semiconductor component.

8. The semiconductor module according to claim 1, wherein:
   said interruption device is configured in an immediate vicinity of said semiconductor component.

9. The semiconductor module according to claim 1, wherein
said temperature sensor is selected from the group consisting of a thyristor and a triac.

10. The semiconductor module according to claim 9, wherein
said temperature sensor does not include a control terminal.

11. The semiconductor module according to claim 1, wherein:
said temperature sensor is constructed as a component selected from the group consisting of a bimetal switch and a melting resistor.

12. The semiconductor module according to claim 1, comprising:
bonding wires for conducting the load current;
said at least one output line defining a plurality of output lines;
said bonding wires connecting said semiconductor component to said plurality of said output lines; and
said interruption device configured underneath said bonding wires.

13. The semiconductor module according to claim 1, wherein
said interruption device contains a material selected from the group consisting of an ignitable material and a volume-expansive material.

14. The semiconductor module according to claim 1, wherein
said interruption device contains a volume-expansive material exhibiting a characteristic when the second temperature threshold is exceeded; and
the characteristic is selected from the group consisting of a frothing characteristic, an oxidizing characteristic, and an explosive characteristic.

15. The semiconductor module according to claim 1, wherein:
said temperature sensor is selected from the group consisting of a thyristor and a triac; and
said temperature sensor also forms said interruption device.

16. The semiconductor module according to claim 1, wherein:
said semiconductor component has a load system;
said temperature sensor has a load system; and
said interruption device is a fuse connected in series with said load system of said semiconductor component and said load system of said temperature sensor.

17. The semiconductor module according to claim 1, wherein:
said semiconductor component is a controllable power semiconductor component.

18. The semiconductor module according to claim 1, wherein:
said semiconductor component is a power MOSFET.

19. The semiconductor module according to claim 1, wherein:
said semiconductor component and said temperature sensor are monolithically integrated into a single chip.

* * * * *